United States Patent
Wu et al.

(10) Patent No.: US 7,619,448 B2
(45) Date of Patent: Nov. 17, 2009

(54) REPLICA BIAS CIRCUIT FOR HIGH SPEED LOW VOLTAGE COMMON MODE DRIVER

(75) Inventors: Charles Qingle Wu, Palo Alto, CA (US); Yun-Hak Koh, San Ramon, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 36 days.

(21) Appl. No.: 12/002,618

(22) Filed: Dec. 17, 2007

(65) Prior Publication Data

US 2009/0153219 A1    Jun. 18, 2009

(51) Int. Cl.
H03B 1/00     (2006.01)
H03K 19/094   (2006.01)

(52) U.S. Cl. .................. 327/108; 330/258; 326/121; 326/127

(58) Field of Classification Search ............... 326/68, 326/63, 81, 83, 115, 121, 127; 327/108, 327/333
See application file for complete search history.

(56) References Cited

U.S. PATENT DOCUMENTS

| | | | |
|---|---|---|---|
| 5,023,488 | A | 6/1991 | Gunning |
| 5,959,492 | A * | 9/1999 | Khoury et al. ............. 327/389 |
| 7,098,699 | B2 * | 8/2006 | Tamura et al. ............. 327/108 |
| 7,471,107 | B1 * | 12/2008 | Fortin et al. .................. 326/83 |
| 2002/0190795 | A1 | 12/2002 | Hoang |
| 2004/0100838 | A1 | 5/2004 | Tamura et al. |
| 2006/0244530 | A1 | 11/2006 | Kocaman et al. |
| 2007/0279105 | A1 * | 12/2007 | Sunairi ..................... 327/108 |

OTHER PUBLICATIONS

Palmer, R. et al., "A 14mW 6.25Gb/s Transceiver in 90nm CMOS for Serial Chip-to-Chip Communications," 2007 IEEE International Solid-State Circuits Conference, pp. 440-441, 614.
Wong, K et al., "A 27-mW 3.6-Gb/s I/O Transceiver," IEEE Journal of Solid-State Circuits, vol. 39, No. 4, Apr. 2004.
Djahanshahi, H. et al., "Gigabit-per-Second, ECL-Compatible I/O Interface in 0.35-[mu]m CMOS", IEEE Journal of Solid-State Circuits, Aug. 1999, vol. 34, No. 8, 20 pages.
PCT/US2008/083943, PCT International Search Report and Written Opinion of the International Searching Authority, mailed Mar. 17, 2009, 10 pages.

* cited by examiner

*Primary Examiner*—Vibol Tan
(74) *Attorney, Agent, or Firm*—Blakely Sokoloff Taylor & Zafman LLP (57) ABSTRACT

A transmitter provides fast settling times, slew rate control, and power efficiency while reducing the need for large external capacitors. The transmitter typically includes a pre-driver, driver, and replica circuit. The pre-driver can shift the voltage level of an input signal to produce a shifted signal. The pre-driver can shift the voltage level in response to a selectable load resistance circuit and a voltage regulation feedback signal. The driver receives the shifted signal and generates a driver output signal in response to the received shifted signal. The replica circuit can be a scaled replica of the pre-driver and the driver using scaled components from the pre-driver and driver circuits. The scaled components can be used to generate the voltage regulation feedback signal. The generated voltage regulation feedback signal represents, for example, whether the output voltage of the driver output is above a reference voltage.

16 Claims, 13 Drawing Sheets

REPLICA BIAS CIRCUIT FOR HIGH SPEED LOW VOLTAGE COMMON MODE DRIVER

TECHNICAL FIELD

This disclosure relates generally to drivers, and more particularly, but not exclusively, relates to low voltage differential signaling devices.

BACKGROUND INFORMATION

Relatively long signal paths are a major bottleneck in digital transmission. For example, printed circuit boards often contain circuitry that is responsible for voltage level shifting and electrostatic discharge protection on relatively long wiring paths. In addition, the circuitry often requires a relatively large amount of current to drive large resistive and capacitive loads that are presented by the relatively long wiring. Thus, the circuitry often uses large pad areas (and large passive components) and also uses a large portion of the overall power used. The large areas and components are often used to help the power consumed by the circuitry.

BRIEF DESCRIPTION OF THE DRAWINGS

Non-limiting and non-exhaustive embodiments of the disclosure are described with reference to the following figures, wherein like reference numerals refer to like parts throughout the various views unless otherwise specified.

DETAILED DESCRIPTION

Embodiments of a replica bias circuit for a high speed low voltage common mode driver are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In general, various high speed differential serial link standards have been designed to accommodate increased off-chip data rate communications. High speed USB, firewire (IEEE-1394), serial ATA and SCSI are a few of the standards used for serial data transmission in the PC industry. Low voltage differential signaling (LVDS) has also been implemented in transmission-side serial data communications.

Additionally, vendors (such as cellular phone companies) have proposed a "subLVDS" standard, which is a smaller voltage-swing variant of the LVDS standard. SubLVDS has been suggested for use in the Compact Camera Port 2 (CCP2) specification for serial communications between (for example) image sensors and onboard systems.

CCP2 is part of the Standard Mobile Imaging Architecture (SMIA) standard. Typical LVDS/subLVDS levels have an output common mode level (Vcm) between supply voltages VDD and VSS. For example, transmitters (Tx) for CCP2 normally have an output signal swing (Vod) of 150 mV with center voltage Vcm at 0.9V.

In addition to high speed image data, low speed chip control signals are often transmitted between host and client. Several new protocols have been developed for high speed ("HS") to low power ("LP") state changes using common mode levels. A joint effort among various cellular phone companies has defined a new physical layer (PHY) standard. The PHY standard defines the Mobile Industry Processor Interface (MIPI), which combines high speed image data transmission and low speed control signals in a single communication signal path ("lane").

Figure 1:
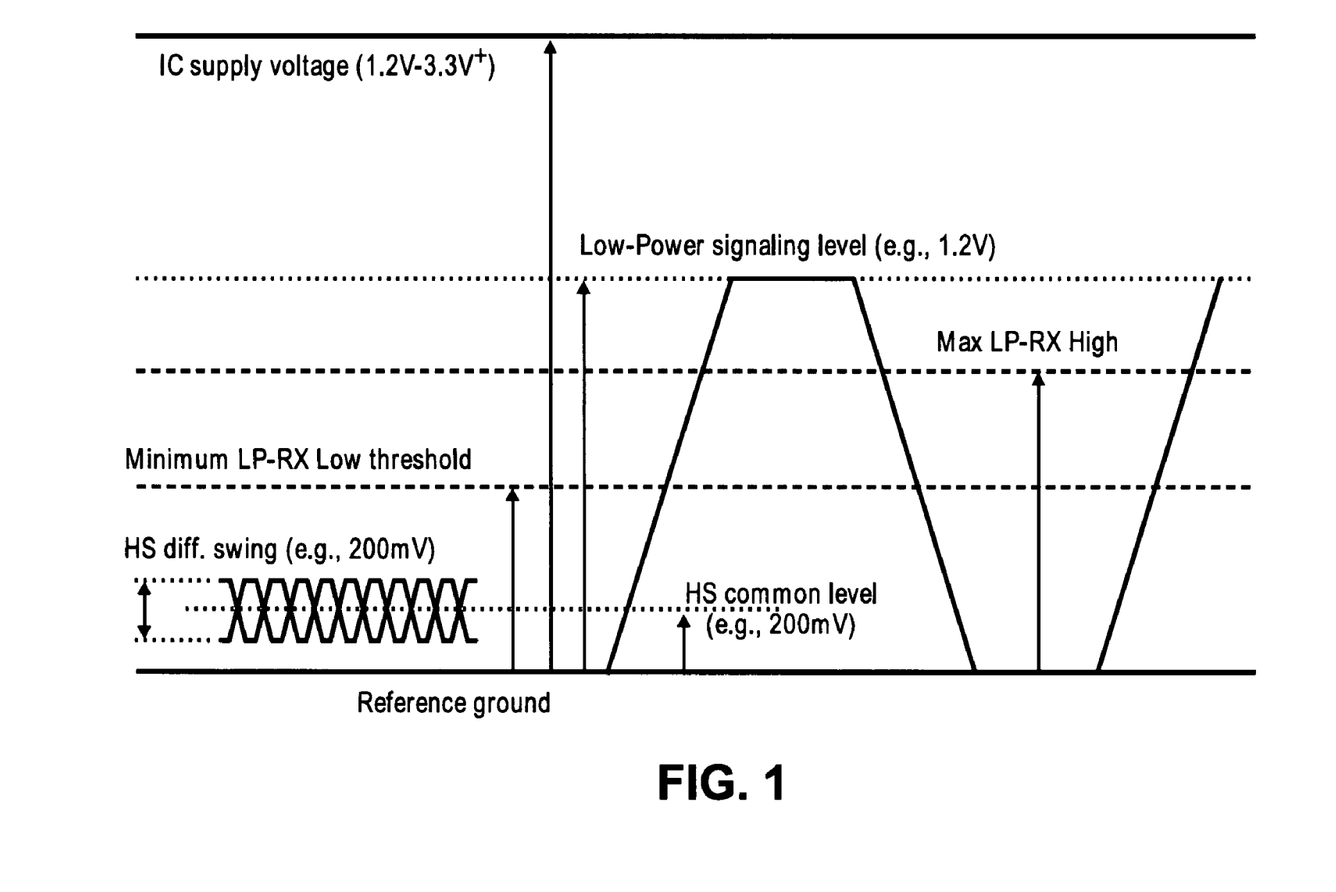
FIG. 1 is an illustration of sample MIPI PHY output line levels.

FIG. 1 is an illustration of sample MIPI PHY output line levels. Transmitter functions (such as a "lane state") can be programmed by driving the lane with certain line levels. For example, the high speed transmission (HS-TX) drives the lane differentially with a low common mode voltage level (Vcm: 0.2V) and small amplitude (Vod: 0.2V). In the HS-TX state, the logic high level (Voh: 0.3V) of HS-TX is relatively much lower than VDD.

During a low speed transmission (LP-TX), the output signal normally toggles between 0V and 1.2V. In transition from the HS-TX to the LP-TX state, an LP logic high is presented at the same time on both output pads (Dp and Dn) by raising the Vcm from a low level of 0.2V to a high level of 1.2V. A receiver (coupled to the output of the transmitter) on the client side adjusts its receiving state from HS to LP in response to the asserted LP logic high presentation.

Figure 2:
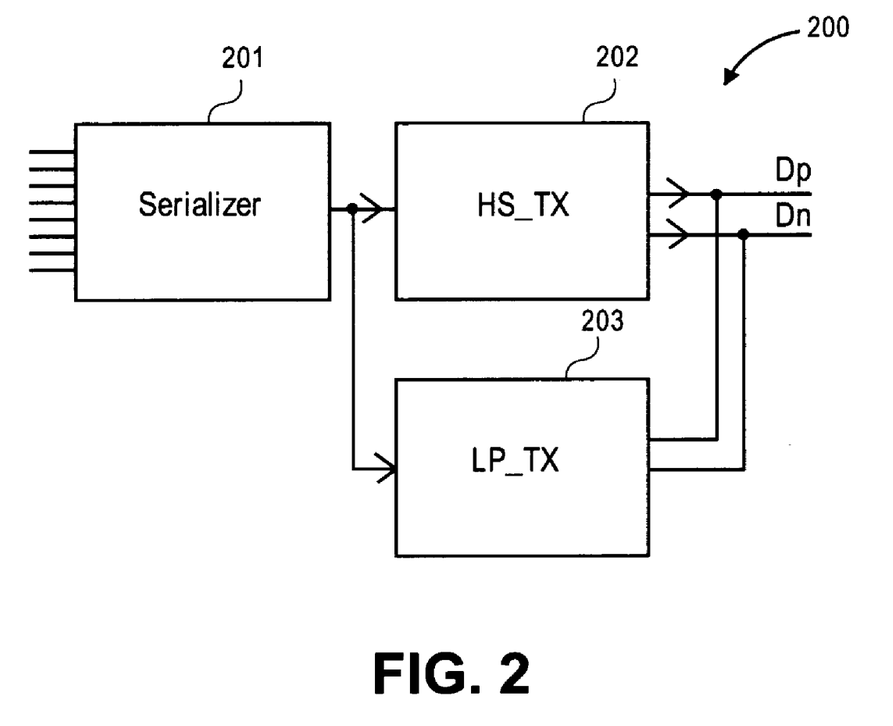
FIG. 2 is an illustration of a sample MIPI transmitter.

FIG. 2 is an illustration of a sample MIPI transmitter. MIPI transmitter 200 includes serializer 201, HS-TX transmitter 202 and LP-TX transmitter 203. Serializer 201 (also referred to as a multiplexer, or "MUX") converts parallel data into a single data channel having a higher rate of transmission. As shown by the Figure, HS and LP transmissions can share the same physical lane to reduce the number of package pins and cost of packaging.

Figure 3:
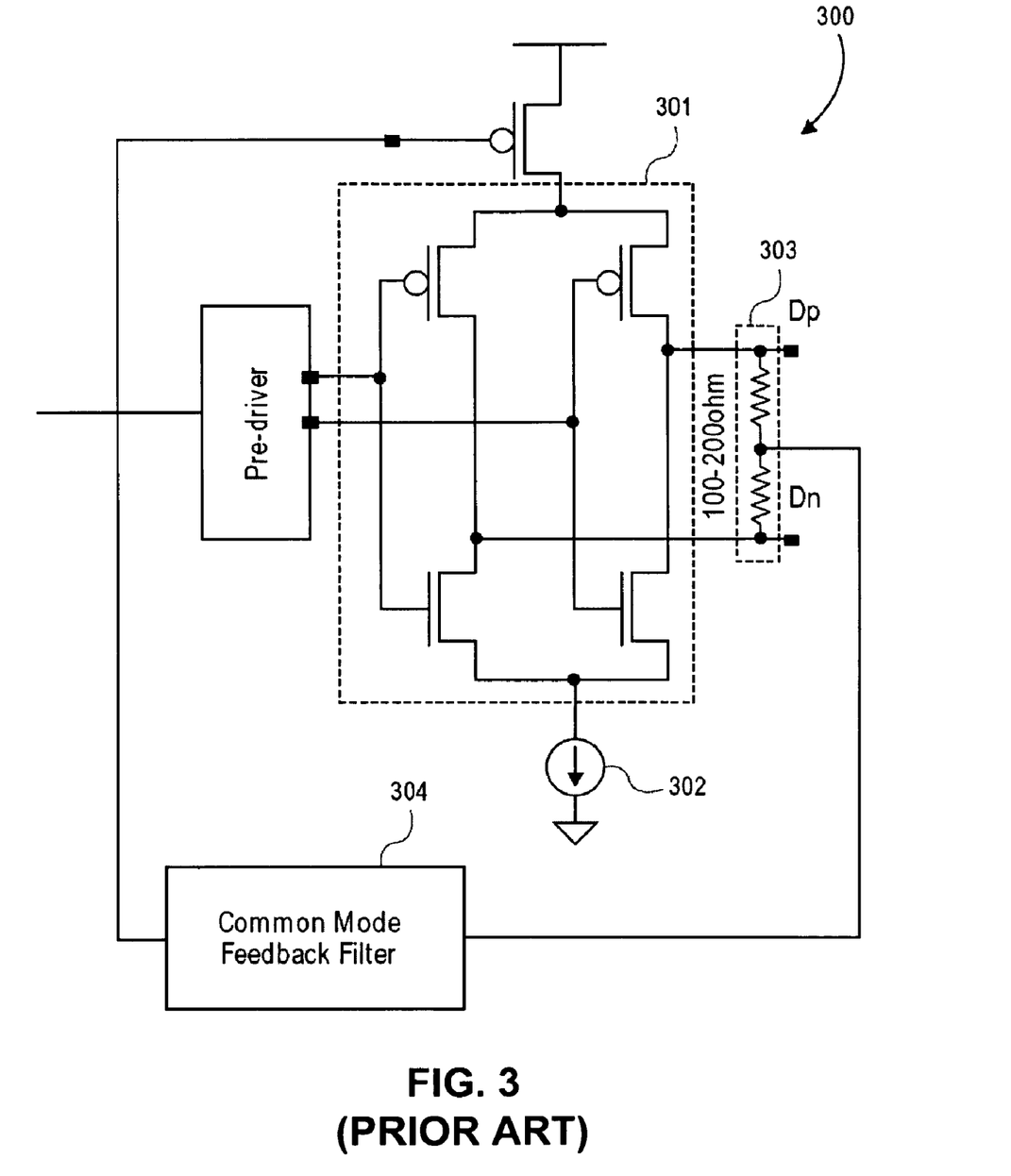
FIG. 3 is an illustration of a conventional LVDS driver.

FIG. 3 is an illustration of a conventional LVDS driver. The conventional LVDS/subLVDS driver 300 is designed as a differential current switch pair 301 with a current source 302. The tail current from differential current switch pair 301 is adjusted to control the output voltage swing Vod. The common mode level Vcm is sensed by tapping the mid-point of back termination resistor 303. The Vcm is tracked and adjusted by using common mode feedback filter 304 in real time.

In high speed (such as gigabits per second) transmission, a certain degree of impedance matching (between the transmitter outputs, receiver inputs, and the characteristic impedance of the transmission lane) is normally used if the transmission line is relatively long. To help impedance matching, the conventional LVDS driver 300 also includes 100-200 ohm back termination resistor 303 on chip between output pads (Dp and Dn) to improve differential reflection coefficients lower than −10 dB at frequencies of typical interest. A power penalty of an additional 50% to 100% of the final output driver current is typically consumed by back termination resistors.

However, the high speed settling time requirements during a mode change (from LP to HS in MIPI protocol) can often inhibit real-time Vcm tracking by using a conventional analog common mode feedback loop. The conventional analog common mode feedback loops typically provide response time that is too long to provide sufficiently fast feedback signals.

Figure 4:
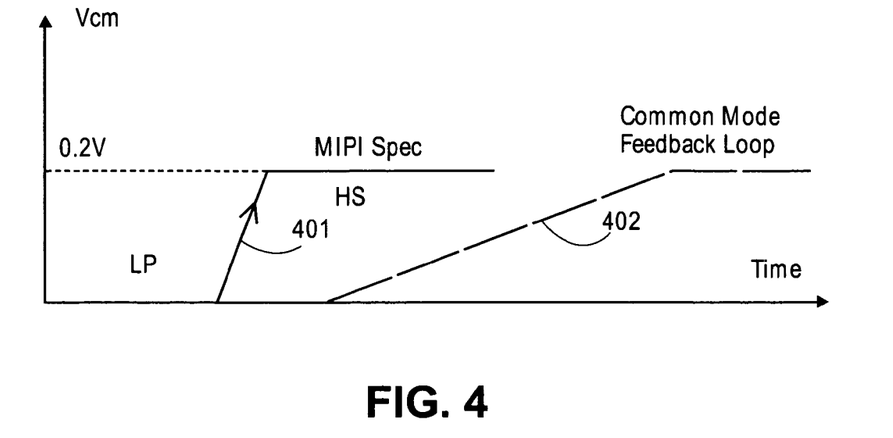
FIG. 4 illustrates a comparison of a sample MIPI-specified common mode level settling time with respect to a conventional common mode feedback loop.

FIG. 4 illustrates a comparison of a sample MIPI-specified common mode level settling time with respect to a conventional common mode feedback loop. Trace 401 illustrates the MIPI-specified transition time from LP mode to HS mode, whereas trace 402 illustrates the response time of the common mode feedback loop. It can be seen that the longer response time of the conventional analog common mode feedback loop would normally prevent realtime Vcm tracking during a mode change from LP to HS mode.

A PMOS current source based LVDS driver uses a back termination resistor 303 to meet the differential S22 specification (which is an output reflection coefficient for a two-port network connection) because of several limitations. Because the Vcm for indicating mode HS is low (0.2V), the LVDS driver 300 cannot otherwise have a current source to VSS. Additionally, a PMOS current source to VDD would present a high impedance path to VDD, which would increase response times. The use of a back termination resistor (such as resistor 303) still presents a high impedance path to VDD and GND for common mode levels. In a lossy environment, it demonstrates higher Vcm ripple at higher speed transmission.

Figure 5:
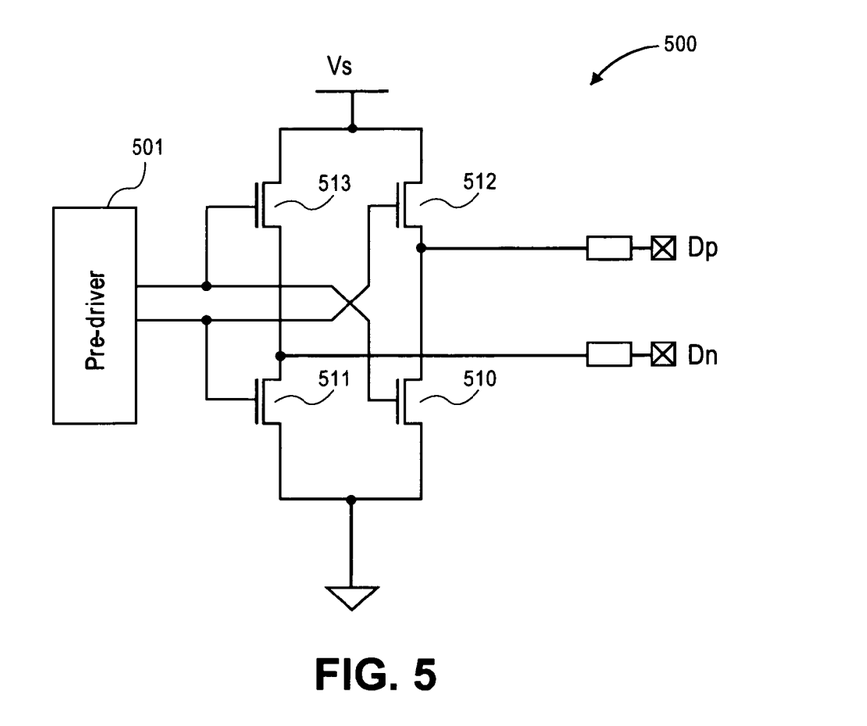
FIG. 5 illustrates a sample high speed NMOS-based differential high speed LCM driver with adjustable Vdd (power supply).

FIG. 5 illustrates a sample high speed NMOS-based differential high speed LCM driver. Driver 500 includes pre-driver 501 and (NMOS) transistors 510, 511, 512, and 513 configured in a "no-tail current" arrangement. Without back termination resistor, the driver 500 can improve the power efficiency of the circuit. Back termination resistance (Rout) can be directly determined by the output impedance of the switching NMOS transistors. Back termination impedances of 50 ohms single-ended or 100 ohms differential back termination can be achieved by careful transistor sizing and biasing. Thus transistor sizing and bias conditions, rather than tail current, can be used to determine the Vod and Vcm.

Figure 6:
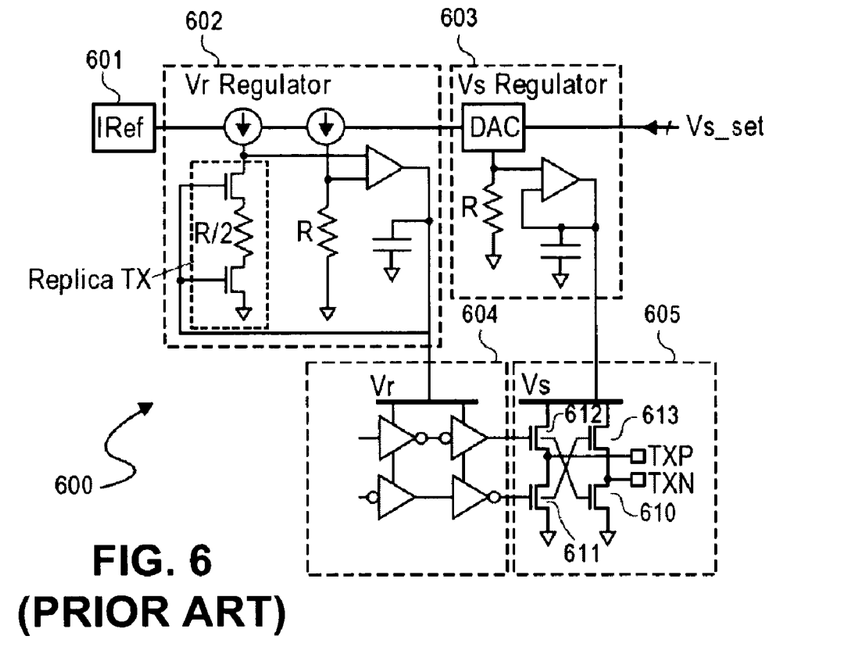
FIG. 6 is an illustration of a conventional regulator bias circuit.

Variations of processes used to manufacture driver 500 can result in products having a relatively large variation of Vod, Vcm, and Rout over various process corners. For example, both the logic high level Vr of the pre-driver 501 and the final output driver power supply Vs (see VS regulator 603 below) contribute to the variations.

FIG. 6 is an illustration of a conventional regulator bias circuit. Driver 600 includes current reference 601, Vr regulator 602, Vs regulator 603, pre-driver 604, and transmitter 605. Vr regulator 602 and VS regulator 603 can be adjusted independently to control Vod, Vcm, and Rout of the driver 600. Vs is typically set to a level that is close to the output high level of the pull up transistors 612 and 613 of transmitter 605, while the output low level of the pull down transistors 610 and 611 of transmitter 605 are normally around VSS.

Transistors 610, 611, 612, and 613 are biased in a linear biasing region because the Vds is relatively small (around 0.1V~0.25V) while the Vgs of active transistors is relatively high (around 1.0V). For example, transistors 610 and 612 can be activated as a pair while transistors 611 and 613 are inactivated. Likewise, transistors 611 and 613 can be activated as a pair while transistors 610 and 612 remain inactivated.

However, the conventional biasing schemes using Vr and Vs regulators normally require relatively large capacitors (which are often provided externally to the circuit substrate). The physical space that would be required for a sufficiently large power supply for adequately driving the regulators is also relatively large. External precision resistors (which increase space and packaging requirements) are typically used as the resistance reference to improve the matching accuracy of circuit components.

Because of the relatively fast switching specification from the LP mode to HS mode, replica biasing circuitry for a final driver and pre-driver is normally left powered up. The replica biasing circuitry is normally left powered on even when in LP state so that the circuitry can respond quickly. Accordingly, the amount of power consumed by replica circuits is often a major consideration when allocating power budgets.

Variations in Vod, Vcm, and Rout signals are often caused by mismatching of components between replica and real drivers. Mismatch analysis and results of Monte-Carlo simulations of multiple loop regulators show potentially greater mismatches in conventional circuits than the replica bias circuit disclosed below with reference to the following figures. The Figures below illustrate a sample LCM output driver, a sample pre-driver circuit, a sample replica bias circuit, and sample combinations thereof.

Figure 7:
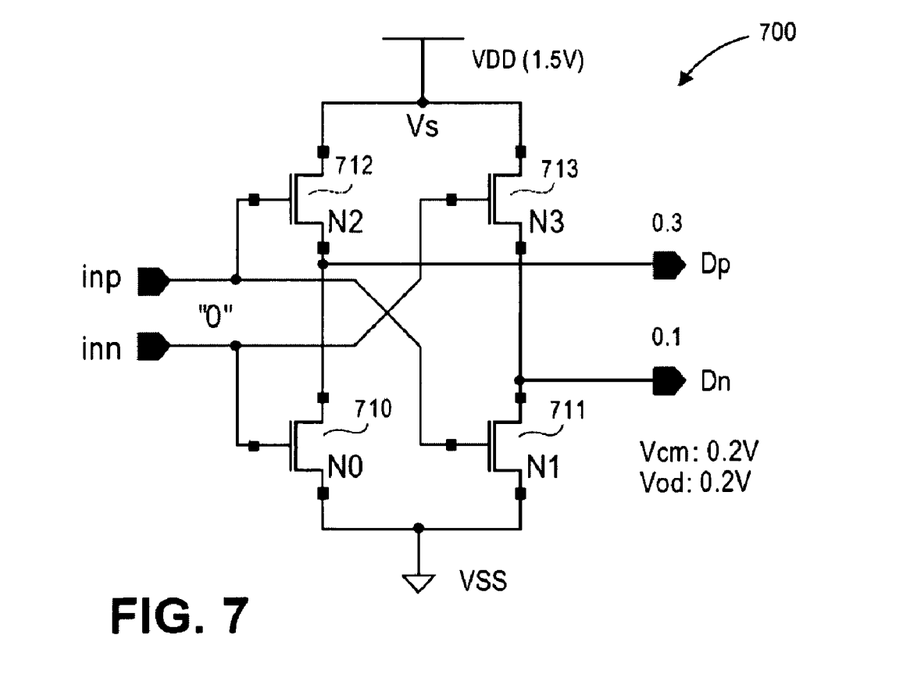
FIG. 7 is a schematic diagram illustrating a sample low power low common mode driver with fixed Vdd (power supply).

FIG. 7 is a schematic diagram illustrating a sample low power low common mode driver. LCM driver 700 and NMOS transistors 710, 711, 712, and 713 are configured in a "no-tail current" arrangement. The drains of transistors 712 and 713 (node Vs) are coupled to core power supply VDD directly as illustrated in FIG. 7. The logic low level of pre-driver of node "inn" (for example, in a particular logic state) is designed to be low enough to turn off transistors 710 and 713. In this way, the Vds of pull up transistor 712 is high enough to bias transistor 712 in a saturation region rather than in a linear region. Accordingly, transistor 712 acts as a standard source follower with an output level that is controlled by the logic high level of pre-driver Vr (which is described below with reference to FIG. 8).

Transistor 711 (when acting as a pull-down resistor) is biased in the linear region in accordance with Equation (1):

$$Rout1 = d(Vds)/d(Ids) = 2/[\mu nCox\, W1/L1(Vr-Vth)] \qquad (1)$$

where d(Vds) is the drain-source voltage at node "Dn", d(Ids) is the drain-source current at node "Dn", μnCox is the electron mobility and capacitance of the gate of transistor 711, Vr is the logic high level, Vth is the threshold voltage, and W1/L1 is the width-to-length ratio of the gate of transistor 711.

Transistor 712 (when acting as a pull-up resistor) is biased in the saturation region in accordance with Equation (2):

$$\begin{aligned} Rout2 &= d(Vds2)/d(Ids) \\ &= d(-Voh)/d(Ids) \\ &= 1/[\mu nCox\, W2/L2(Vr-Vth-Voh)] \end{aligned} \qquad (2)$$

where $d(\,)$ is the derivative of $(\,)$,

μnCox is the electron mobility and capacitance of the gate of transistor 712, Vr is the logic high level, Vth is the threshold voltage, Voh is the overhead voltage (Vr−Vth), and W2/L2 is the width-to-length ratio of the gate of transistor 712. The bulk effect of transistor 712 can be ignored because the transistor source voltage is at or close to ground.

Equations (1) and (2) can be related as shown by Equation (3):

$$W1/L1(Vr\cdot Vth)\{Voh - [1/2\mu nCox\, W2/L2(Vr-\cdot Vth - Voh)^2]Rext\} = W2/L2(Vr\cdot Vth\cdot Voh)^2 \qquad (3)$$

Equation 3 demonstrates that the output resistances (Rout) for both the pull-down and pull-up transistors are determined by electron mobility, the W/L ratio, and Vr−Vth (or Voh).

When a replica circuit feedback loop is designed to regulate Vr to produce a fixed Voh, the logic high level (which varies to around 0.3V) of the output (Vr−Vth) typically will not substantially change over process corners. No substantial change of Rout over process corners is typically produced because (as in Equation 3) μn is close to a constant over process corners (but not over temperature). Thus, a replica loop is disclosed for adjusting Vr to make Vr−Vth constant over process corners.

Voh and Vcm are important parameters used to achieve the output design margins for a receiver in which to differentiate HS and LP state correctly. A fixed Voh (controlled by a feedback signal) can be defined as a voltage that remains near Vcm + ½Vod. The fixed Voh confines Vcm and Vod variations to a minimum over process and temperature corners.

Figure 8:
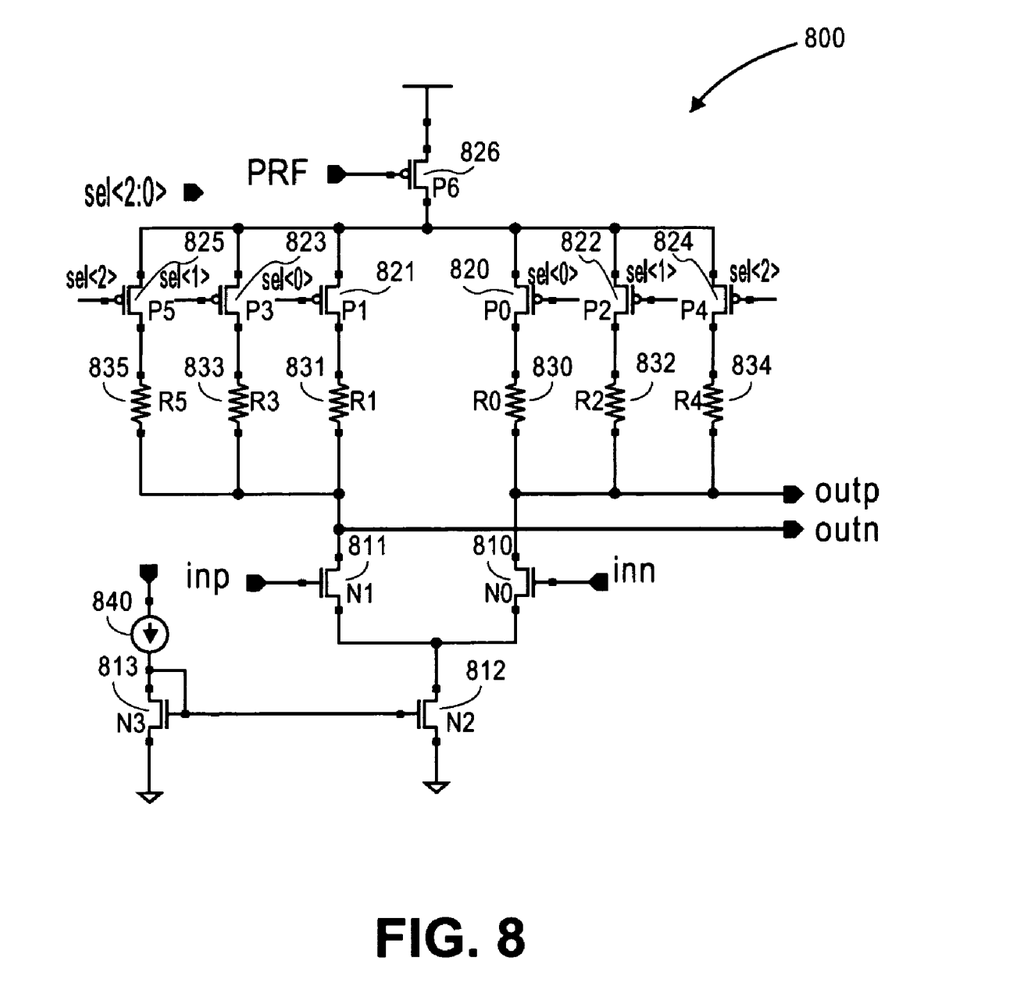
FIG. 8 is a schematic diagram illustrating a sample current mode logic (CML) driver.

FIG. 8 is a schematic diagram illustrating a sample current mode logic (CML) driver. Driver 800 is a sample selectable load resistance circuit that includes transistors 810, 811, 812, 813 (all NMOS), transistors 820, 821, 822, 823, 824, 825, 826 (all PMOS), resistors 830, 831, 832, 833, 834, 835, and current source 840.

Driver 800 can be used as a pre-driver in an LCM driver. Driver 800 uses current mode logic (CML), instead of a rail-to-rail CMOS architecture. The output voltage swing of the driver 800 can be set by the tail current of a current source (transistor 812) and load resistance to assure to reach a logic low and high level to turn off (in one example) transistors 713 and 710 and to turn on transistors 711 and 712 in the driver 700. Transistor 826 can be used as an adjustable resistor to control the voltage drop from VDD. Accordingly, the logic high level Vr can be adjusted by the PRF, as discussed below with reference to FIG. 9.

A digital switch signal (sel<2:0>) can be used to select a load resistance for driver 800. The tail current of driver 800 is controlled by a matrix of selectable resistors. The effective resistance in the example circuit can be selected by the setting values of the digital switch signal. Thus the output swing amplitude, current consumption, and slew rate of driver 800 can be set by programmable control logic. The switchable biasing for the circuit allows the slew rate of the output signal to be adjusted for serving different data rate applications. Thus, the digital switch signal can be used to program the output signal strength in accordance with a desired operating mode.

Figure 9:
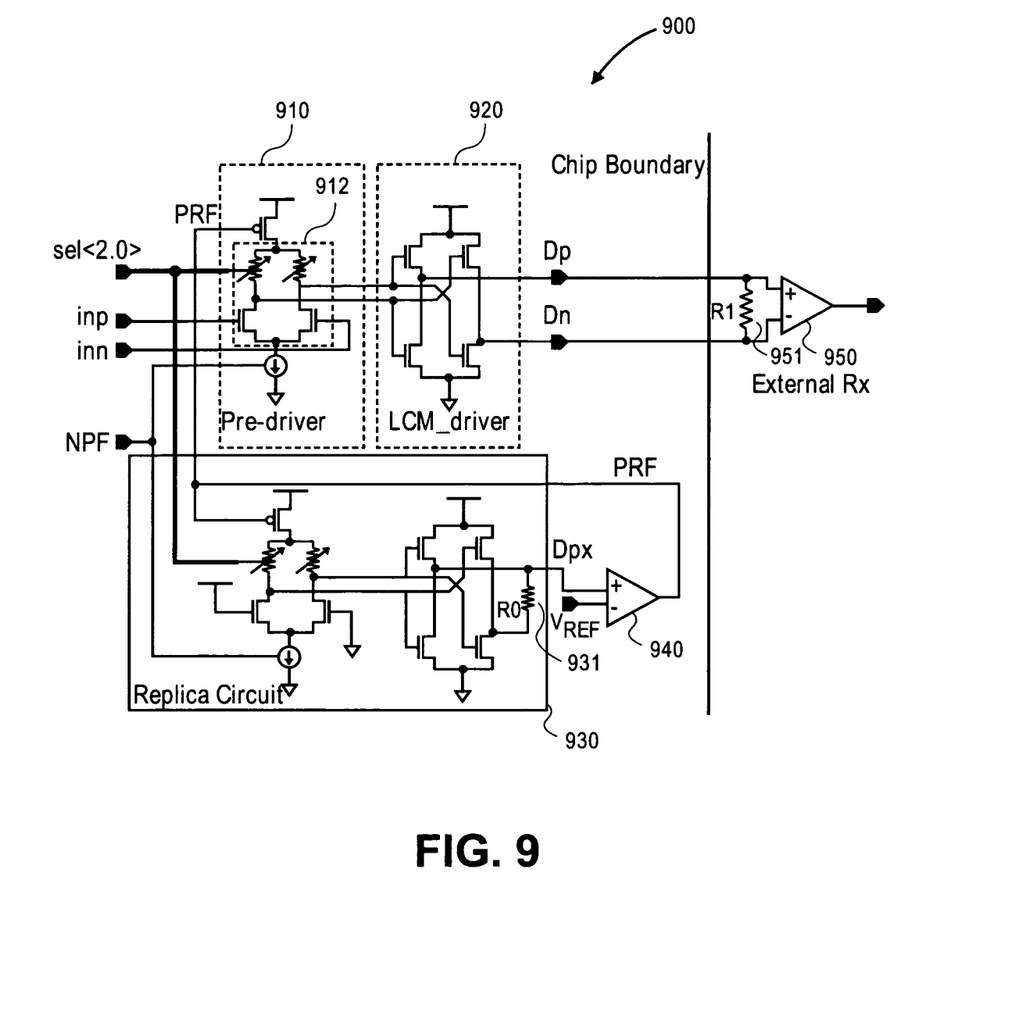
FIG. 9 is a schematic diagram illustrating a sample differential transmitter having a CML driver and a replica bias circuit.

FIG. 9 is a schematic diagram illustrating a sample differential transmitter having a CML driver and a replica bias circuit. Transmitter 900 includes pre-driver 910, LCM driver 920, replica circuit 930, and amplifier 940. Pre-driver 910 can be a driver as illustrated in FIG. 8. LCM driver 920 can be a driver as illustrated in FIG. 7. The outputs of transmitter 900 can be coupled to an external receiver 950, for example. The pre-driver 910 converts the voltage level of an input signal to produce a shifted output signal. The pre-driver 910 shifts the voltage in response to a selectable load resistance circuit (912) and a voltage regulation feedback signal (PRF). The driver 920 receives the shifted signal and generates a driver output signal (Dp and Dn) in response to the received shifted signal. The replica circuit 930 comprises scaled components (discussed below) from the pre-driver and driver circuits. The scaled components are used to generate the voltage regulation feedback signal. The generated voltage regulation feedback signal is representative of an output voltage of the driver output signal.

Replica circuit 930 typically includes a scale replica of pre-driver 910 and LCM driver 920. The scale replica is sized to produce a current that is around (for example) one-tenth of the current consumed by the operative circuits pre-driver 910 and LCM driver 920. For example, the width of transistors in the replica can be one-tenth of the counterparts in the pre-driver 910 and LCM driver 920, and the replica resistors can be ten times as large as the corresponding resistors in the pre-driver 910 and LCM driver 920. Also for example, when the termination resistor 951 of external receiver is 100 ohms, the counterpart resistor 931 in replica circuit 930 can be chosen to be 1000 ohms.

Because voltage levels of the nodes are set by IR drops (such as by the effective resistance across a resistor or transistor), scaling down current and scaling up resistance using the same scale factor helps to ensure that the voltage levels between the operative circuits and the replica counterparts are the same. Additionally, voltage mismatches are minimized because the replica can be designed using similar structures and manufactured by the same processing steps. Thus the operating voltage levels between the operative and the replica circuits can be designed to be substantially the same. When the power inputs of replica circuit 930 are coupled to VDD and GND and the output V(Dpx) of the replica circuit 930 set to a level of logic high, V(Dpx) of the replica circuit typically equals the Voh of the operative circuitry.

Amplifier 940 in the example is a high gain operational amplifier (op-amp) that compares V(Dpx) with a reference voltage of 0.3V (Vref) to provide a feedback signal PRF for the pre-drivers of both operational and replica circuits. Signal PRF is used to set the Vr of pre-driver 910, which accordingly to forces the output Voh and V(Dpx) to a nominal 0.3V.

Thus, a sample replica bias circuit is disclosed that uses a feedback loop to force Voh close to 0.3V. Conventional approaches that track Vcm (0.2V) or logic low output level Vol (0.1 V) normally entail more mismatch error because Vcm and Vol are smaller in magnitude than Voh. In addition, more errors are typically produced by operational amplifiers when comparing the smaller voltage levels used in conventional approaches.

The single feedback loop transmitter design minimizes design complexity as well as simplifies chip layout. The CML based pre-driver has a constant current from VDD to VSS. Therefore power supply and ground bouncing is typically less than the bouncing encountered when using a CMOS (rail-to-rail) pre-driver. A single power supply as low as 1.0V can be used, although a 1.5V supply can be directly used from core logic. The settling time of HS can be two orders of magnitude faster than typical common mode feedback based designs. Higher power efficiency can be achieved without using back termination resistors. The replica bias circuit can maintain a relatively narrow range of performance of Vcm, Vod, and output impedance over typical process, power supply and temperature corners.

Figure 10:
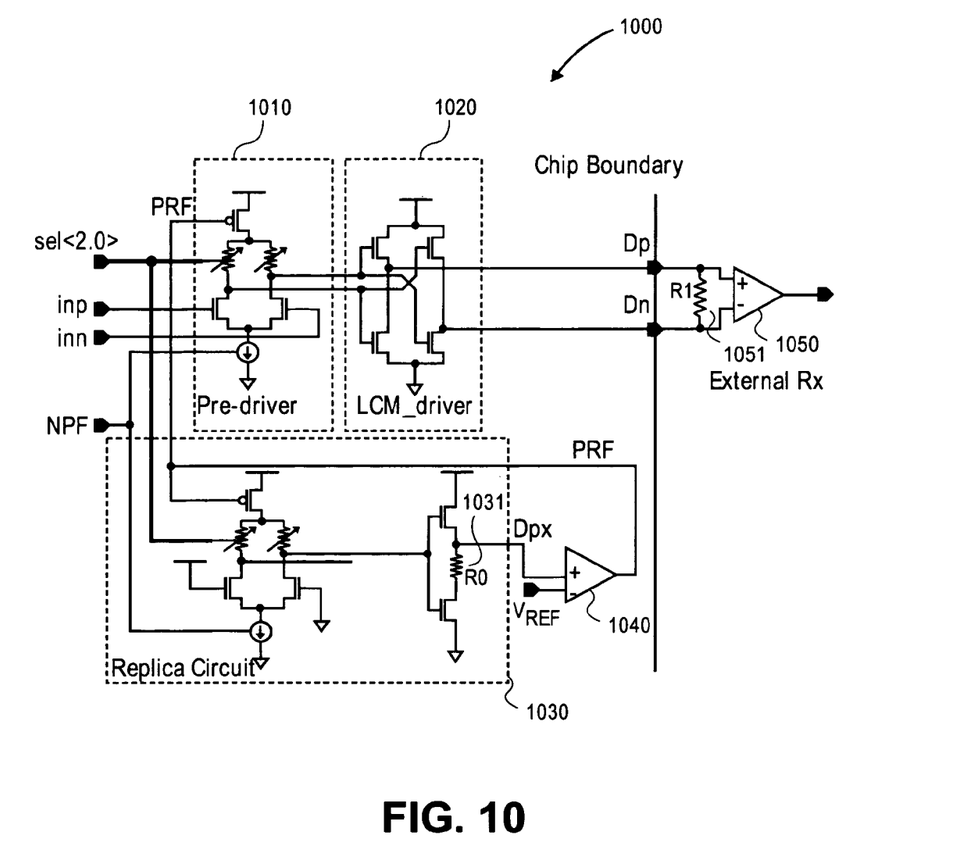
FIG. 10 is a schematic diagram illustrating a sample differential transmitter having a CML driver and a replica circuit having inactive transistors removed.

FIG. 10 is a schematic diagram illustrating a sample differential transmitter having a CML driver and a replica circuit having inactive transistors removed. Transmitter 1000 includes pre-driver 1010, LCM driver 1020, replica circuit 1030, and amplifier 1040. The outputs of transmitter 1000 can be coupled to an external receiver 1050, for example. External receiver 1050 includes termination resistor 1051. Resistor 1031 is normally a scale replica of resistor 1051. The alternative replica circuit 1030 does not include transistors of the replica LCM driver 1020 where current through the transistors is expected to be close to zero (such as when using a 3.3V NMOS process to improve ESD robustness).

Figure 11:
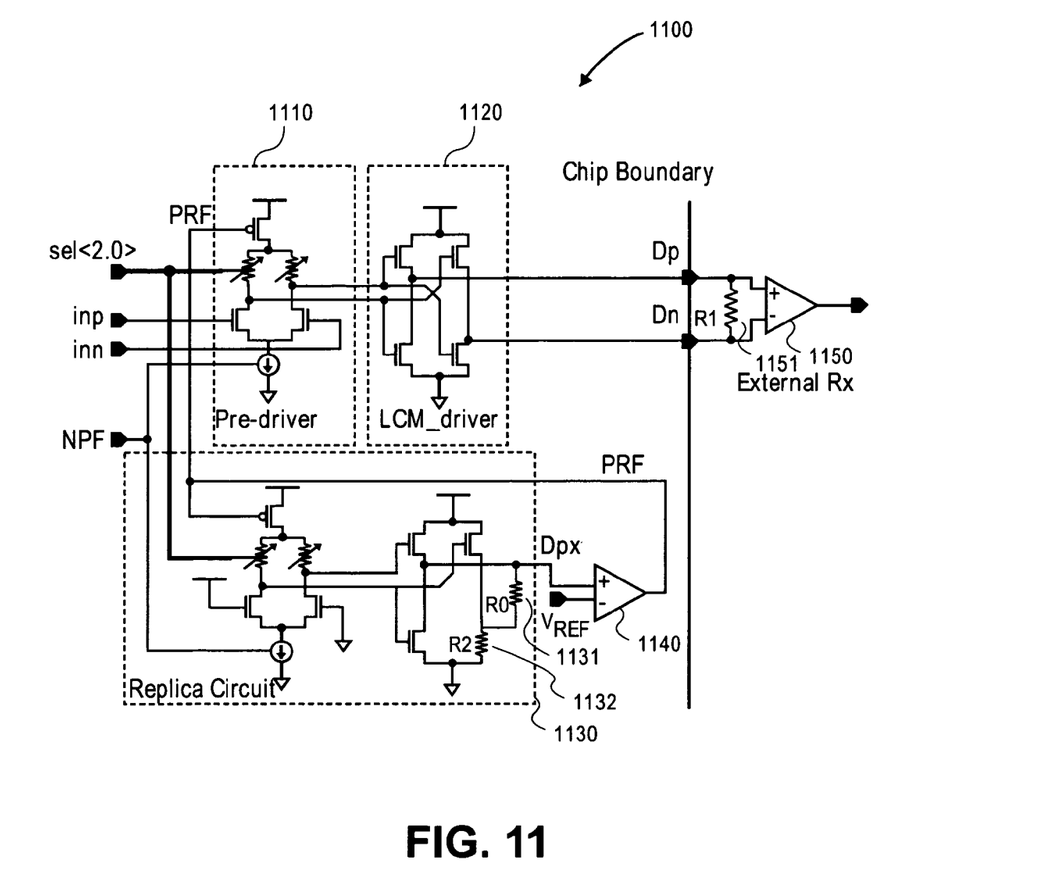
FIG. 11 is a schematic diagram illustrating a sample differential transmitter having a CML driver and a replica circuit having a pull-down transistor replaced with a pull-down resistor.

FIG. 11 is a schematic diagram illustrating a sample differential transmitter having a CML driver and a replica circuit having a pull-down transistor replaced with a pull-down resistor. Transmitter 1100 includes pre-driver 1110, LCM driver 1120, replica circuit 1130, and amplifier 1140. The outputs of transmitter 1100 can be coupled to an external receiver 1150, for example. External receiver 1150 includes termination resistor 1151. Resistor 1131 can be a scale replica of resistor 1151. The alternative replica circuit 1130 replaces a pull-down NMOS transistor with a pull-down resistor 1132 that is placed in series with resistor 1131.

Figure 12:
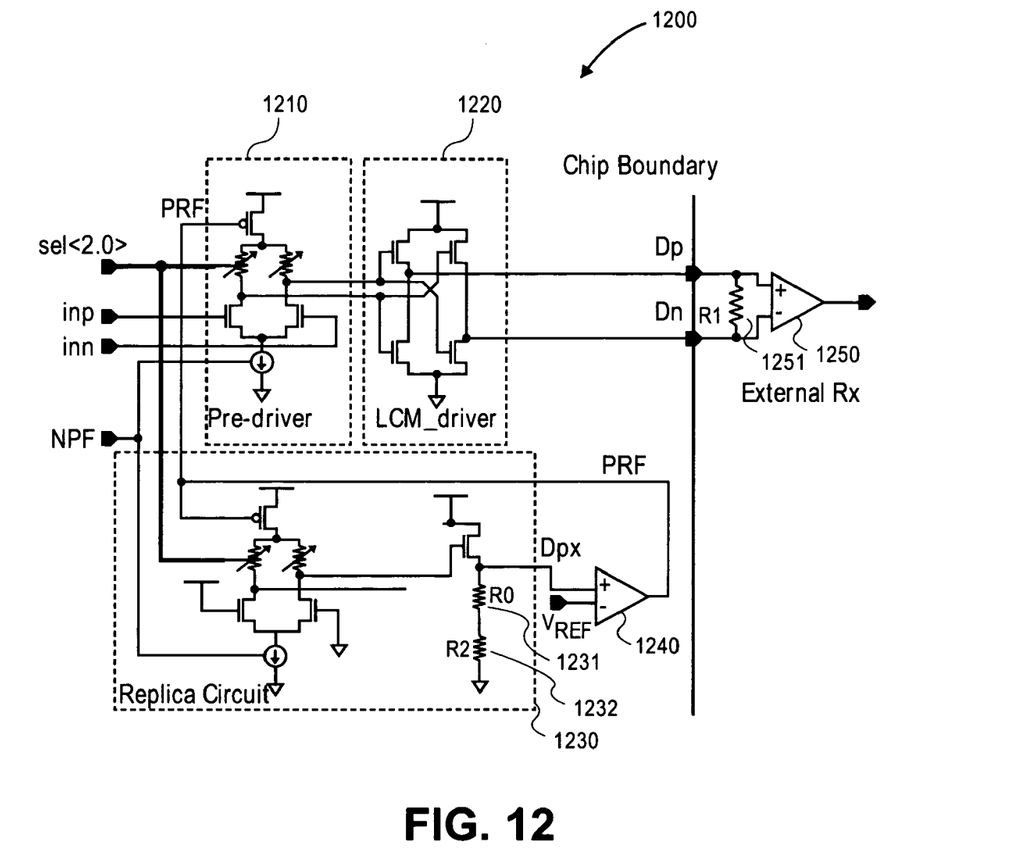
FIG. 12 is a schematic diagram illustrating a sample differential transmitter having a CML driver and a replica circuit having a pull-down transistor replaced with a resistor and with inactive transistors removed.

FIG. 12 is a schematic diagram illustrating a sample differential transmitter having a CML driver and a replica circuit having a pull-down transistor replaced with a resistor and with inactive transistors removed. Transmitter 1200 includes pre-driver 1210, LCM driver 1220, replica circuit 1230, and amplifier 1240. The outputs of transmitter 1200 can be coupled to an external receiver 1250, for example. External receiver 1250 includes termination resistor 1251. Resistor 1231 can be a scale replica of resistor 1251. The alternative replica circuit 1230 replaces a pull-down NMOS transistor with the resistor 1232. The alternative replica circuit 1230 typically does not include inactive transistors of the replica LCM driver 1220.

Figure 13:
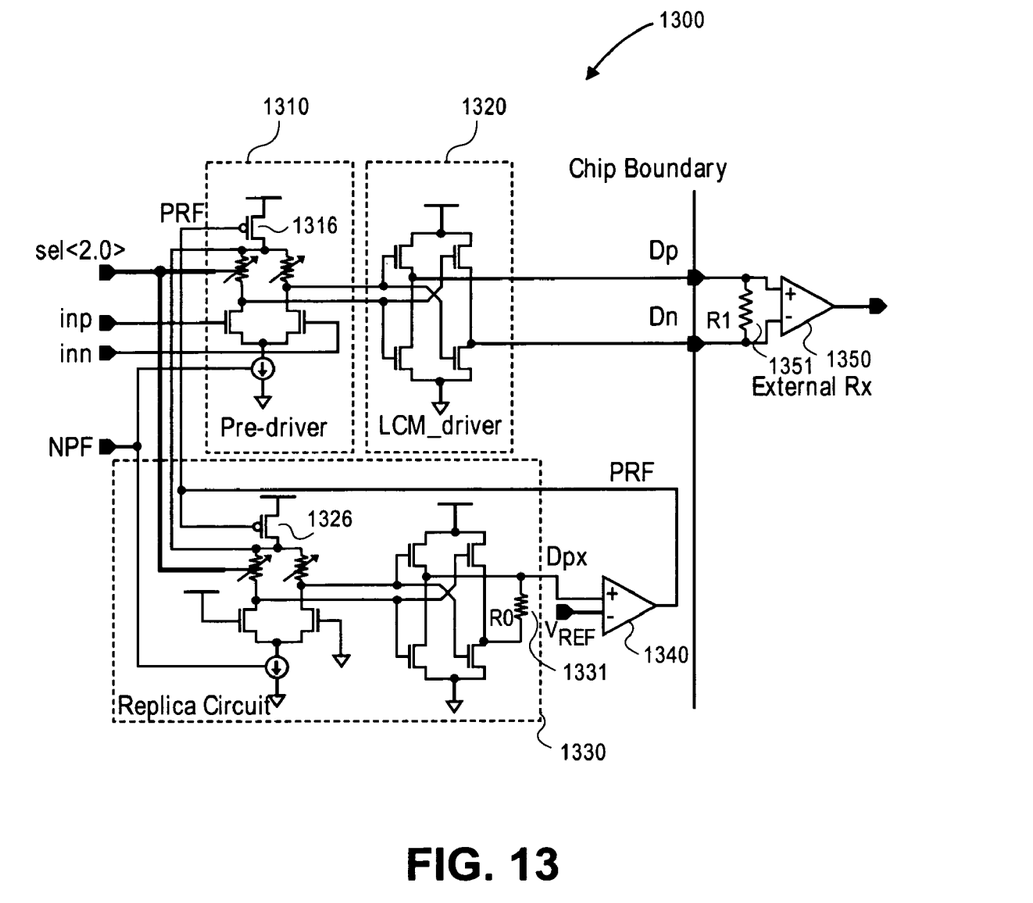
FIG. 13 is a schematic diagram illustrating a sample differential transmitter having the drain of a PMOS transistor coupled to both the replica and the active driver.

FIG. 13 is a schematic diagram illustrating a sample differential transmitter having the drain of PMOS (acting as an adjustable resistor) tied together on both the replica and the active driver. This design reduces the Vr mismatch between the active and the replica driver. Transmitter 1300 includes pre-driver 1310, LCM driver 1320, replica circuit 1330, and amplifier 1340. The outputs of transmitter 1300 can be coupled to an external receiver 1350, for example. External receiver 1350 includes termination resistor 1351. Resistor 1331 can be a scale replica of resistor 1351. The alternative replica circuit 1330 couples the drain of transistor 1316 to its counterpart (transistor 1326) in replica circuit 1330 which reduces logic high level mismatching between pre-driver 1310 and replica circuit 1330. This configuration can be used when pre-driver circuit 1310 is always on.

Figure 14:
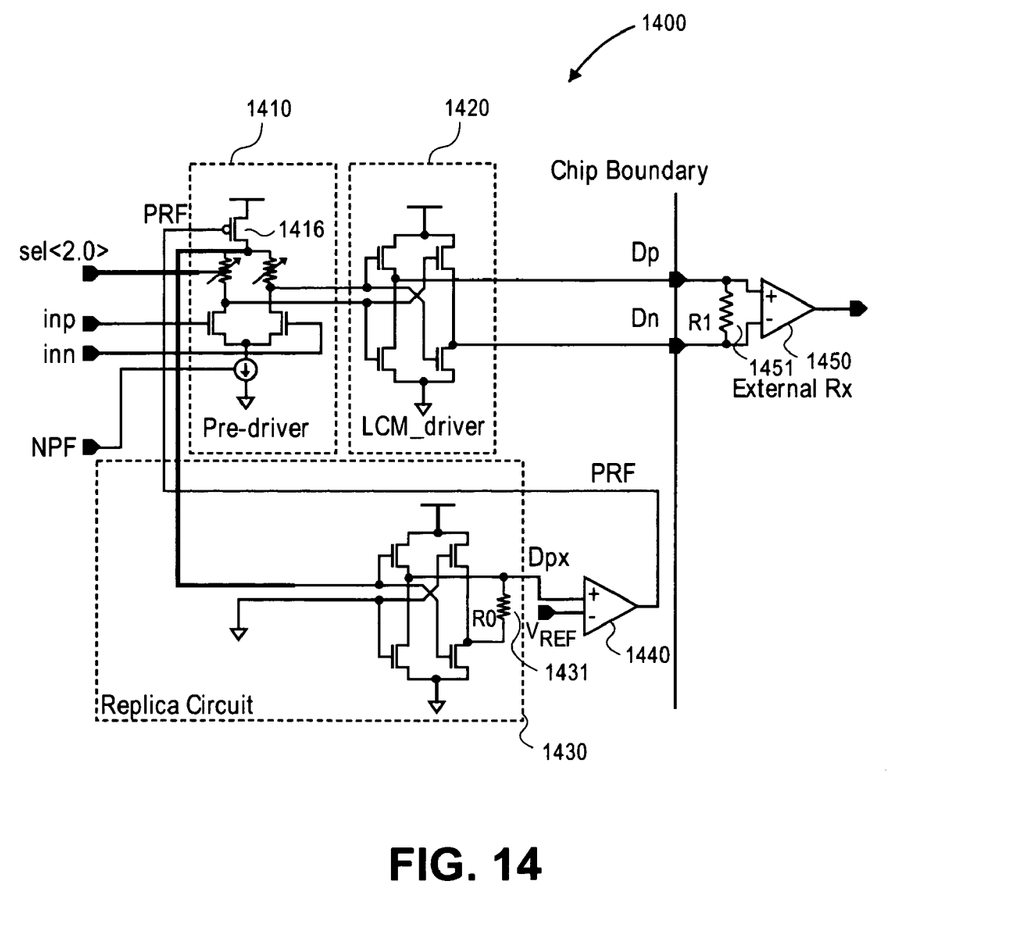
FIG. 14 is a schematic diagram illustrating a sample differential transmitter with the logic high of an active LCM driver directly used for the dummy and final driver.

FIG. 14 is a schematic diagram illustrating a sample differential transmitter with the logic high of active LCM driver used for the dummy and the final driver directly. Transmitter 1400 includes pre-driver 1410, LCM driver 1420, replica circuit 1430, and amplifier 1440. The outputs of transmitter 1400 can be coupled to an external receiver 1450, for example. External receiver 1450 includes termination resistor 1451. Resistor 1431 can be a scale replica of resistor 1451. The alternative replica circuit 1430 couples the drain of transistor 1416 to an input of a driver portion of replica circuit 1430, which reduces logic high level mismatching between pre-driver 1410 and replica circuit 1430. This configuration can be used when pre-driver circuit 1410 is always on and is based on the sample transmitter in FIG. 13 by having deleted the inactive transistors.

Figure 15:
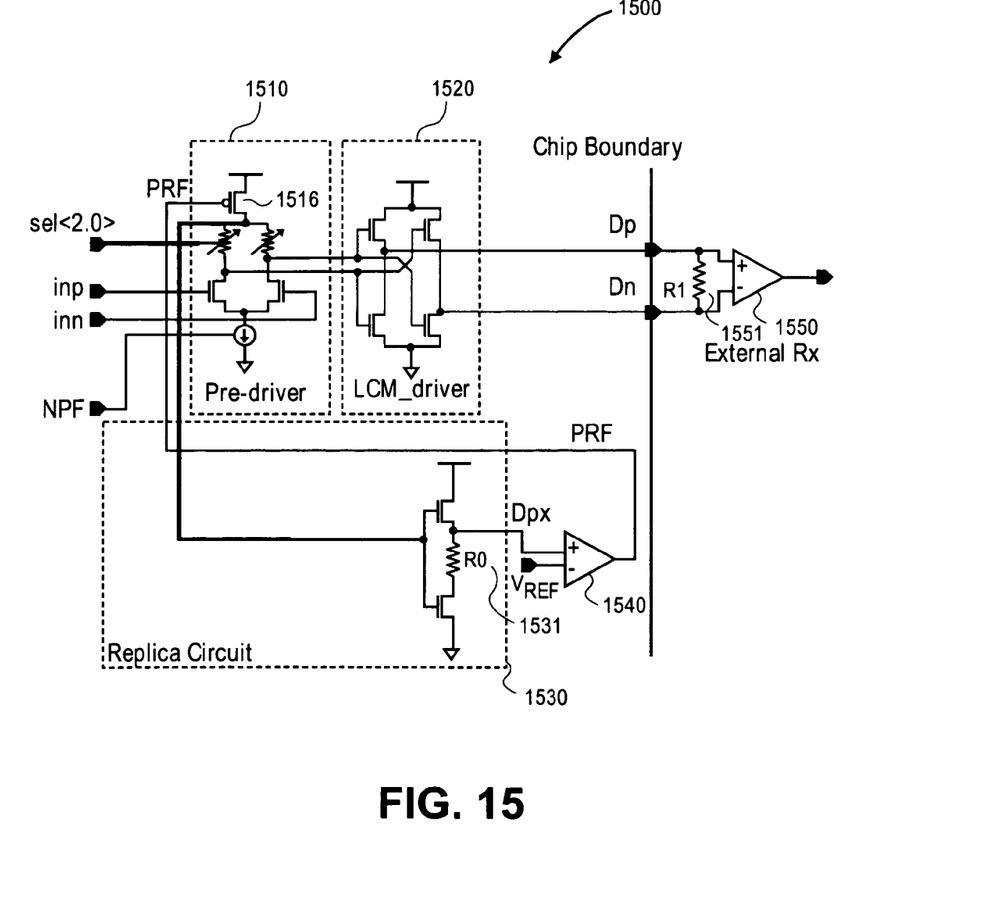
FIG. 15 is a schematic diagram illustrating a sample differential transmitter with the logic inverter with a resistor used for the dummy and final driver.

FIG. 15 is a schematic diagram illustrating a sample differential transmitter with the login high of active LCM driver used for the dummy and the final driver directly, and with inactive transistors removed. Transmitter 1500 includes pre-driver 1510, LCM driver 1520, replica circuit 1530, and amplifier 1540. The outputs of transmitter 1500 can be coupled to an external receiver 1550, for example. External receiver 1550 includes termination resistor 1551. Resistor 1531 can be a scale replica of resistor 1551. The alternative replica circuit 1530 couples the drain of transistor 1516 to the gates of output transistors for a driver portion of replica circuit 1530, which reduces logic high level mismatching between the pre-driver 1510 and the replica circuit 1530. This configuration can be used when pre-driver circuit 1510 is always on and is based on the sample transmitter in FIG. 14.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A transmitter, comprising:
a pre-driver coupled to shift a voltage level of an input signal to produce a shifted output signal, wherein the pre-driver shifts the voltage level of the input signal in response to a selectable load resistance circuit and a voltage regulation feedback signal;
a driver to receive the shifted output signal and to generate a driver output signal in response to the shifted output signal; and a replica circuit coupled to the pre-driver and the driver, the replica circuit comprising scaled components from the driver circuit, wherein the scaled components are used in generating the voltage regulation feedback signal, wherein the voltage regulation feedback signal is representative of an output voltage of the driver output signal, wherein the replica circuit comprises a scaled pre-driver that shifts the voltage in response to a scaled selectable load resistance circuit and the voltage regulation feedback signal.

2. The transmitter of claim 1, wherein the replica circuit comprises components that have a scaling factor of 10 with respect to corresponding components in the pre-driver and driver.

3. The transmitter of claim 1, wherein the selectable load resistance circuit comprises potential current paths in parallel, wherein each potential current path comprises a P-type transistor and a resistor coupled in series.

4. The transmitter of claim 1, wherein the input signal and the driver output signals are differential signals.

5. The transmitter of claim 4, wherein the pre-driver uses current mode logic.

6. The transmitter of claim 1, wherein the replica circuit comprises a scaled resistor that has a resistance that is scaled to a load resistor of a receiver for receiving the driver output signal.

7. The transmitter of claim 6, wherein the scaled resistor is coupled between a scaled pull-up driver transistor and a pull-down resistor of the replica circuit.

8. The transmitter of claim 1, wherein a drain of a p-type transistor of the pre-driver is coupled to a drain of a scaled p-type transistor of the replica circuit.

9. The transmitter of claim 1, wherein the drain of a p-type transistor of the pre-driver is coupled to the gates of a plurality of scaled n-type transistors of the replica circuit.

10. A method, comprising:
receiving a differential input signal;
shifting voltage levels of the differential input signal to produce a shifted differential output signal in response to a voltage regulation feedback signal;
generating a driver output signal in response to the shifted differential output signal;
generating a replica operating voltage using a replica circuit, wherein the replica circuit comprises scaled components of circuitry used to generate the driver output signal, wherein a portion of the scaled components of the circuit used to generate the driver output signal shifts the voltage in response to a scaled selectable load resistance circuit and the voltage regulation feedback signal; and
comparing the replica operating voltage to a reference voltage to generate the voltage regulation feedback signal, wherein the differential input signal is shifted in response to the voltage regulation feedback signal and a selectable load resistance circuit.

11. The method of claim 10, wherein a strength of the driver output signal corresponds to a high speed mode or a low power to high speed transmission.

12. An apparatus, comprising:
a pre-driver coupled to shift a voltage level of an input signal to produce a shifted output signal, wherein the pre-driver shifts the voltage level of the input signal in response to a voltage regulation feedback signal;
a driver to receive the shifted output signal and to generate a driver output signal in response to the shifted output signal; and
a replica circuit coupled to the pre-driver and driver and that comprises scaled components from the pre-driver and driver circuits, wherein the scaled components and a voltage reference are used to generate the voltage regulation feedback signal, wherein the voltage regulation feedback signal is representative of an output voltage of the driver output signal,
wherein the pre-driver shifts the voltage level in response to the voltage regulation feedback signal and a selectable load resistance circuit,
wherein the replica circuit includes a scaled pre-driver that shifts the voltage in response to a scaled selectable load resistance circuit and the voltage regulation feedback signal.

13. The apparatus of claim 12, wherein the selectable load resistance circuit comprises potential current paths in parallel, wherein each potential current path comprises a P-type transistor and a resistor coupled in series.

14. The apparatus of claim 12, wherein the replica circuit comprises a scaled resistor that has a resistance that is scaled to a load resistor of a receiver for receiving the driver output signal.

15. The apparatus of claim 12, wherein the pre-driver, the driver, and the replica circuit comprise CMOS transistors.

16. The apparatus of claim 12, wherein a drain of a p-type transistor of the pre-driver is coupled to a drain of a scaled p-type transistor of the replica circuit.

* * * * *